(12) United States Patent
Yoo

(10) Patent No.: US 6,500,737 B1
(45) Date of Patent: Dec. 31, 2002

(54) SYSTEM AND METHOD FOR PROVIDING DEFECT FREE RAPID THERMAL PROCESSING

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 09/589,851

(22) Filed: Jun. 8, 2000

(51) Int. Cl.[7] .......................... H01L 21/20; H01L 21/36
(52) U.S. Cl. ...................... 438/502; 438/487; 438/522; 414/271; 432/93
(58) Field of Search ................................ 438/522, 487, 438/502, 54; 414/271; 432/93

(56) References Cited

U.S. PATENT DOCUMENTS

| | | | | |
|---|---|---|---|---|
| 5,138,973 | A | * 8/1992 | Davis et al. | 118/723 |
| 5,399,199 | A | 3/1995 | Kiyama et al. | 118/719 |
| 5,592,581 | A | 1/1997 | Okase | 392/418 |
| 5,879,128 | A | * 3/1999 | Tietz et al. | 414/757 |
| 5,884,009 | A | 3/1999 | Okase | 392/418 |
| 5,968,379 | A | * 10/1999 | Zhao et al. | 219/121.52 |
| 6,133,550 | A | * 10/2000 | Griffiths et al. | 219/403 |
| 6,198,074 | B1 | * 3/2001 | Savas | 219/390 |
| 6,200,634 | B1 | * 3/2001 | Johnsgard et al. | 427/248.1 |
| 6,238,990 | B1 | * 5/2001 | Aga et al. | 438/308 |
| 6,258,220 | B1 | * 7/2001 | Dordi et al. | 204/198 |

FOREIGN PATENT DOCUMENTS

| | | | |
|---|---|---|---|
| JP | 09 330873 | 12/1997 | ............. G03F/7/38 |
| JP | 11 251400 | 9/1999 | ........... H01L/21/68 |

OTHER PUBLICATIONS

"Eliminating Silicon Crystal Defects Induced by Thermal and Gravitational Stresses," Robert H. Nilson and Stewart K. Griffiths; Electrochemical Society Proceedings vol. 99–1, pp. 119–131.

"The Role of Metal Contamination and Crystal Defects in Quarter Micron Technology," M. Obry, W. Bergholz, H. Cerva, W. Küner, M. Schrems, J.–U. Sachse, and R. Winkler; Electrochemical Society Proceedings vol. 99–1, pp. 133–149.

* cited by examiner

Primary Examiner—Matthew Smith
Assistant Examiner—Granvill D Lee, Jr.
(74) Attorney, Agent, or Firm—MacPherson Kwok Chen & Heid LLP

(57) ABSTRACT

A system and method for providing substantially defect free rapid thermal processing. The present invention includes a wafer processing system used to process semiconductor wafers into electronic devices. In accordance with the present invention, once the wafer is processed, a shield can be inserted into the reactor to a position between the reactor heating surface and the wafer. The shield causes the temperature of the wafer to be reduced. Once the temperature of the wafer has been reduced to below a predetermined critical temperature, the robot picks up the wafer and removes the wafer from the processing chamber.

25 Claims, 17 Drawing Sheets

SYSTEM AND METHOD FOR PROVIDING DEFECT FREE RAPID THERMAL PROCESSING

BACKGROUND OF THE INVENTION

1. Field of the Invention

This invention generally relates to semiconductor manufacturing equipment and, more particularly, to a system and method used for rapid thermal processing of a semiconductor wafer.

2. Description of Related Art

In the semiconductor industry, to allow advancements in the development of semiconductor devices, especially semiconductor devices of decreased dimensions, new processing and manufacturing techniques have been developed. One such processing technique is known as Rapid Thermal Processing (RTP), which reduces the amount of time that a semiconductor device is exposed to high temperatures during processing. The rapid thermal processing technique, typically includes raising the temperature of the semiconductor device and holding the device at that temperature for a time long enough to successfully perform a fabrication process, to avoid unwanted dopant diffusion that would otherwise occur at the high processing temperatures.

Unfortunately, wafers which undergo RTP are extremely susceptible to forming defects, such as slip dislocations. Slip generally occurs when transient temperature fluctuations occur during processing at high temperatures (e.g. ~1000° C.). Slip dislocations may also be formed due to thermal or mechanical shock. For example, when the wafer is above a critical temperature for the formation of slip dislocations, contact from a removal device can cause the wafer to be cooled down in a non-uniform manner and/or to be subject to unwanted vibration.

For the above reasons, a system and method are needed for removing a heated wafer from a processing chamber without causing the formation of slip dislocations.

SUMMARY OF THE INVENTION

The present invention provides a system and method for providing substantially defect free rapid thermal processing. The present invention includes a wafer processing system used to process semiconductor wafers into electronic devices. Typically, a carrier containing wafers is loaded into a loading station and transferred to a load lock. Subsequently, a robot picks up a wafer from the carrier and moves the wafer into a reactor (also known as a process chamber). The wafer is processed in the reactor according to well-known wafer processing techniques. In accordance with the present invention, once the wafer is processed, a shield can be inserted into the reactor to a position between the reactor heating surface and the wafer. Once inserted, the shield blocks radiated heat energy from directly impinging on the wafer surface, which causes the temperature of the wafer to be reduced. In a dual heating surface reactor, a second shield may be inserted between the wafer and the second heating surface. Once the temperature of the wafer is reduced to below a predetermined critical temperature, the robot picks up the wafer and removes the wafer from the processing chamber.

In one aspect of the present invention, a semiconductor wafer processing system is provided. The system includes a process chamber, which defines a cavity configured to receive a wafer. The system also includes a robot. The robot is operable to move a wafer to and/or from the process chamber. A shield mechanism is provided which is operable to block the wafer from a heating source.

In another aspect of the present invention, a method is provided for processing a semiconductor wafer. The method includes inserting a shield mechanism into a wafer processing chamber proximate to a processed wafer; where the shield mechanism causes a temperature of the wafer to be reduced.

One advantage of using the shield of the present invention is to cause the temperature of the wafer to be reduced to below a critical slip dislocation formation temperature, by blocking direct radiation heating. Since the temperature is below the critical slip formation temperature, the robot can pick up the wafer without causing thermal and mechanical shock to the wafer, without having to heat the arm or end-effector of the robot. The heat shields also remove the need to lower the temperature of the reactor between each wafer being processed. Accordingly, processing times and system costs are reduced, while wafer defects are minimized.

These and other features and advantages of the present invention will be more readily apparent from the detailed description of the preferred embodiments set forth below taken in conjunction with the accompanying drawings.

DETAILED DESCRIPTION

Figure 1B:
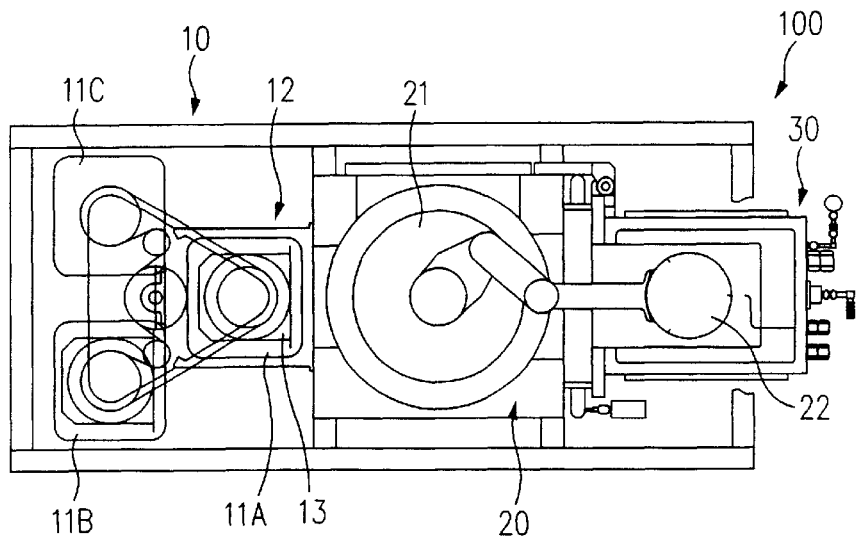
FIGS. 1A and 1B show a side view and a top view, respectively, of a wafer processing system in accordance with the invention.
Figure 1A:
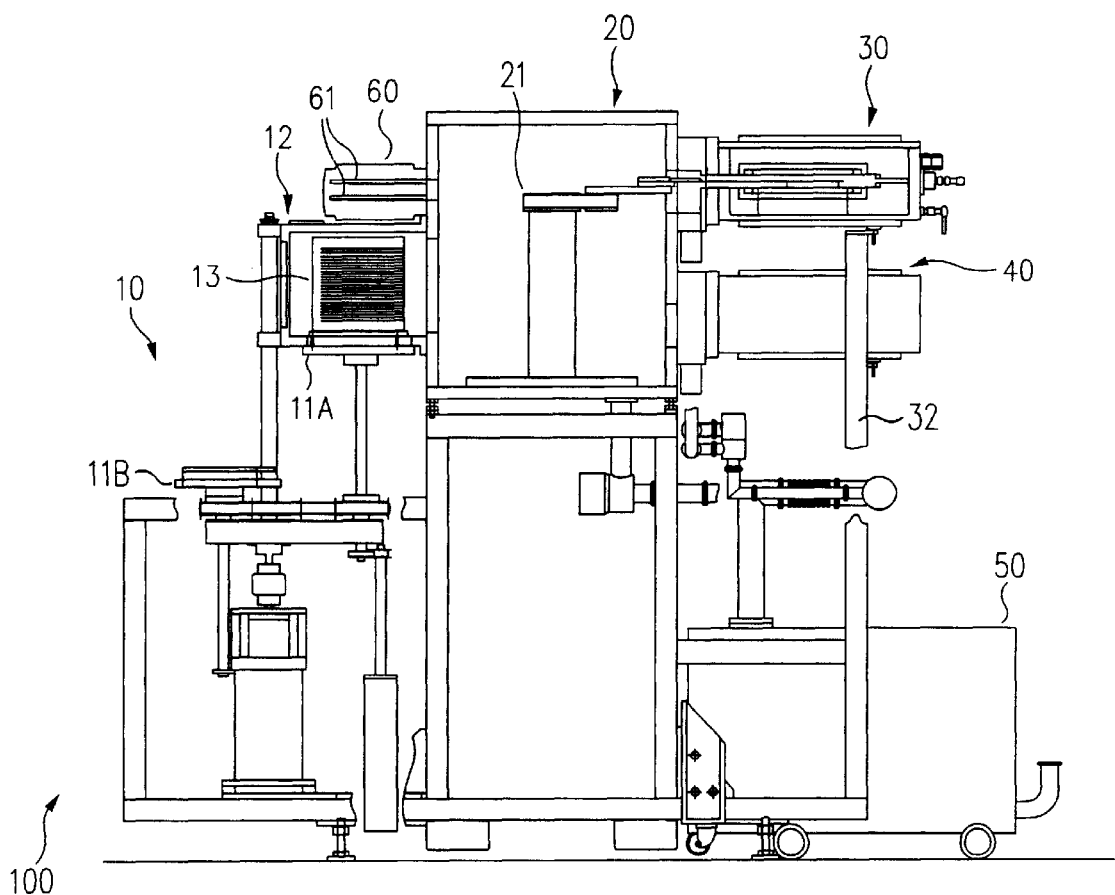

FIGS. 1A and 1B are schematic illustrations of a side view and top view, respectively, of one embodiment of a semiconductor wafer processing system 100 that establishes a representative environment of the present invention. The representative system is fully disclosed in co-pending U.S. patent application Ser. No. 09/451,677, filed Nov. 30, 1999, which is herein incorporated by reference for all purposes. Wafer processing system 100 in accordance with the present invention, includes a loading station 10, a load lock 12, a transfer chamber 20, a robot 21, reactors 30 and 40, and a cooling station 60. Loading station 10 has platforms 11A, 11B, and 11C for supporting and moving wafer carriers, such as a wafer carrier 13, up into load lock 12. While three platforms are used in this embodiment, the invention is not so limited. Two platforms can also be used, as can additional platforms to increase the wafer throughput. Carrier 13 is a removable wafer carrier, which can carry up to 25 wafers at a time. Other types of wafer carriers, including fixed wafer carriers, can also be used. Wafer carriers are loaded onto platforms 11A, 11B, and 11C either manually or by using automated guided vehicles ("AGV"). While the movement of a wafer carrier into load lock 12 is illustrated herein using carrier 13 on platform 11A as an example, the same illustration applies to the movement of other wafer carriers using platforms 11B and 11C. Further, because platforms 11A, 11B, and 11C are structurally and functionally the same, any reference to platform 11A also applies to platforms 11B and 11C.

Figure 2A:
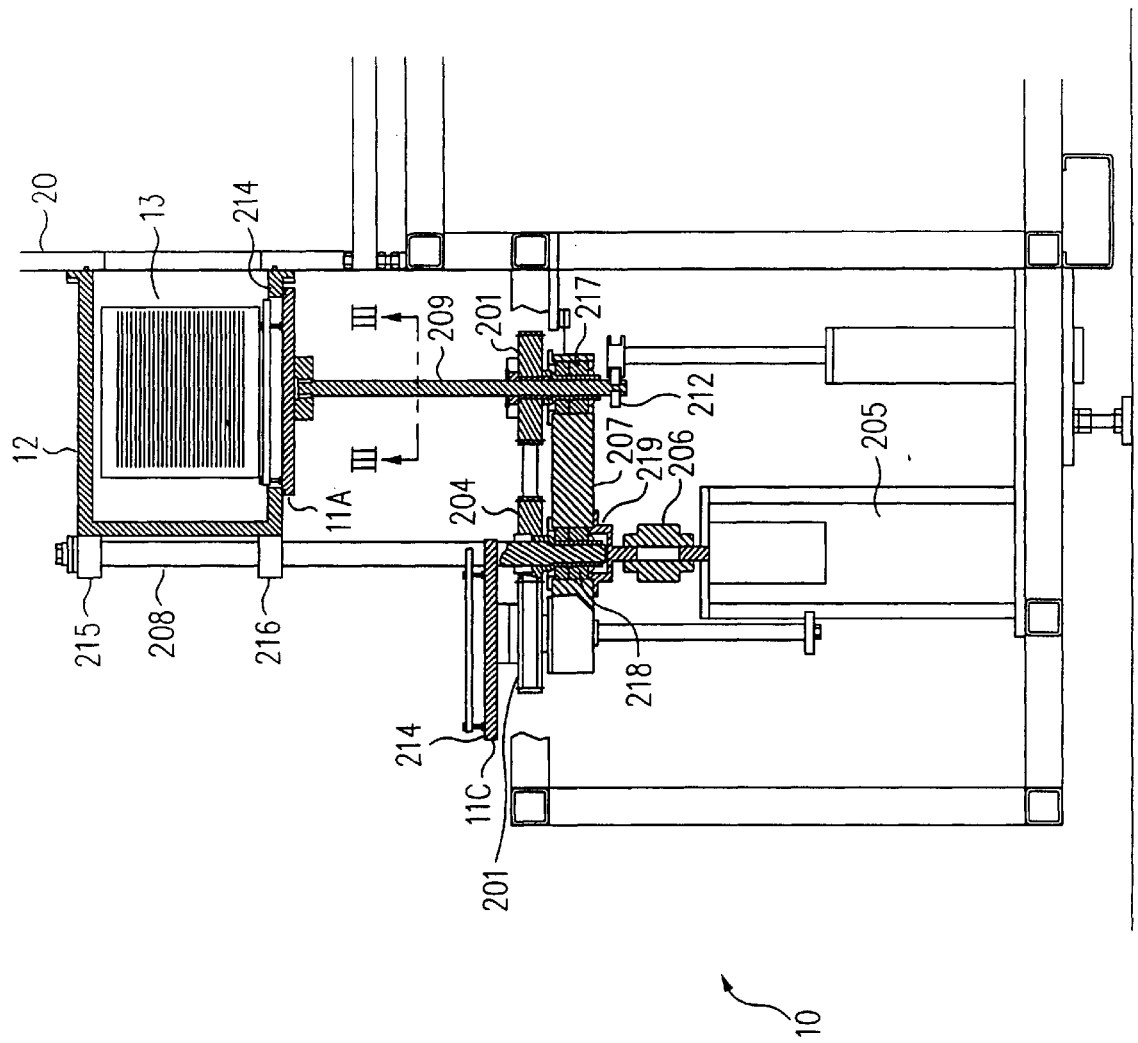
FIGS. 2A and 2B show a side view and a top view, respectively, of a loading station in accordance with the invention.
Figure 2B:
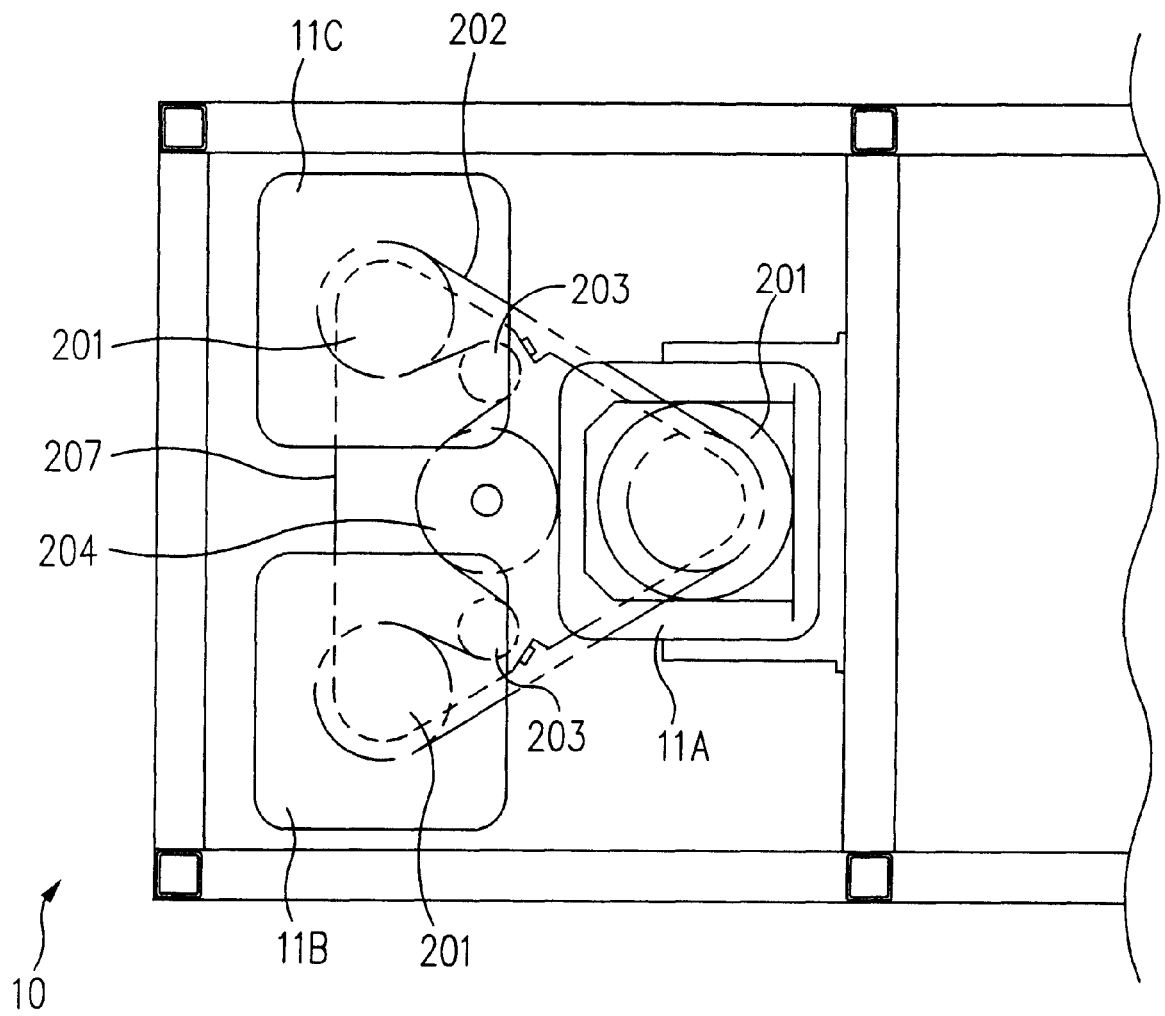

Referring to FIGS. 2A and 2B, which show a side view and a top view of loading station 10, platform 11A includes a driving bar 209 which is coupled to a triangular block 207 via bearings 217. A motor 205 is mechanically coupled to an adapter block 219 using a flexible coupler 206. Adapter block 219 is fixedly attached to triangular block 207. By rotating adapter block 219, motor 205 can thus rotate triangular block 207 which, in turn, rotates platform 11A about a pole 208. A belt 202 is wound through a fixed center pulley 204, fixed platform pulleys 201, and idlers 203 so that the opening of wafer carrier 13, through which wafers are inserted, faces towards robot 21 (see FIG. 1A) as platform 11A is rotated about pole 208. Tension on belt 202 is set by adjusting idlers 203.

As shown in FIG. 2A, load lock 12 is bolted onto transfer chamber 20 and is further supported by pole 208 through hinges 215 and 216. Pole 208 freely rotates through hinge 215, hinge 216, and bearings 218 to prevent vibrations from motor 205 from being transmitted into load lock 12.

Figure 3A:
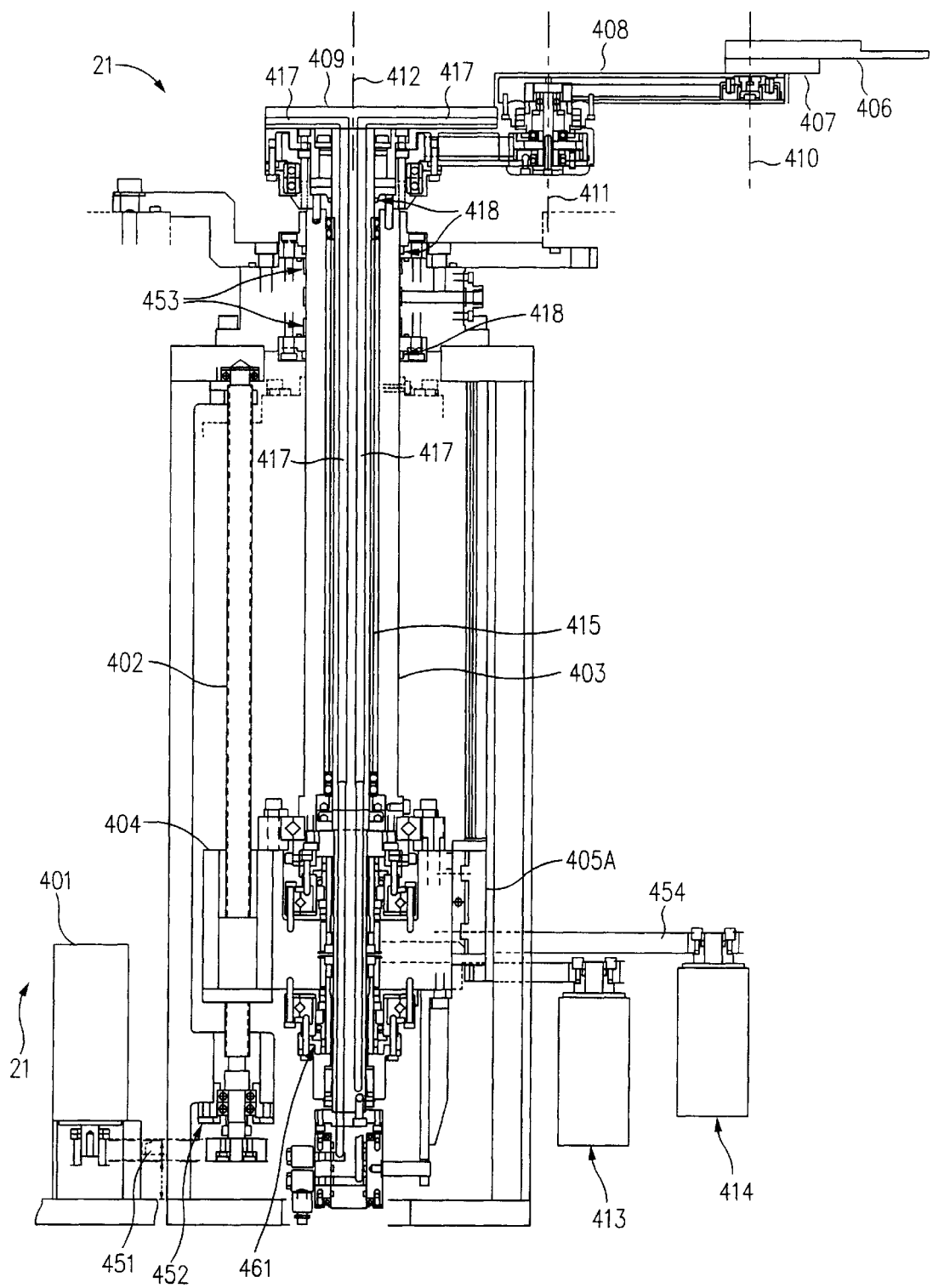
FIG. 3A shows a functional "x-ray" view of a wafer processing robot in accordance with the invention.

In accordance with the invention, robot 21 (FIGS. 1A and 1B) is provided for transporting wafers to and from the modules of system 100, such as reactors 30 and 40, cooling station 60, and load lock 12. FIG. 3A shows an "x-ray" view of an embodiment of robot 21. To improve the clarity of illustration by showing all the relevant parts of robot 21 in one view, FIG. 3A is a functional representation of robot 21 and does not depict actual parts placement. For example, the actual location of a ball screw 402 in relation to the location of linear guides 405A and 405B is depicted in the top view shown in FIG. 3C. The invention is not limited to the specific parts, structures, and parts placement shown in FIGS. 3A–3C. As shown in FIG. 3A, a z-axis (i.e. vertical motion) motor 401 is mechanically coupled to and rotates ball screw 402 via a belt 451. A collar 404 rides on and is driven by ball screw 402. In this embodiment, z-axis motor 401 is the type Part Number SGM-04A314B from Yaskawa Electric ("Yaskawa Electric") of Fukuoka, Japan, while ball screw 402 is the type Part Number DIK2005-6RRG0+625LC5 from THK Corporation Limited ("THK") of Tokyo, Japan. Other conventional ball screws and motors can also be used. A support unit 452 (e.g. THK Part Number FK15) supports ball screw 402. A vertical driver 403, which rides on collar 404, can be moved up or down by using z-axis motor 401 to drive collar 404 via ball screw 402. Vertical driver 403 slides against wear rings 453. Wear rings, generally, prevent metal to metal contact and absorb transverse loads. In one embodiment, wear rings 453 are the type Part Number GR7300800-T51 from Busak+Shamban. Robot 21 also includes a harmonic gear 461 which can be of the same type as Part Number SHF-25-100-2UH from Harmonic Drive Systems Inc. of Tokyo, Japan.

Figure 3B:
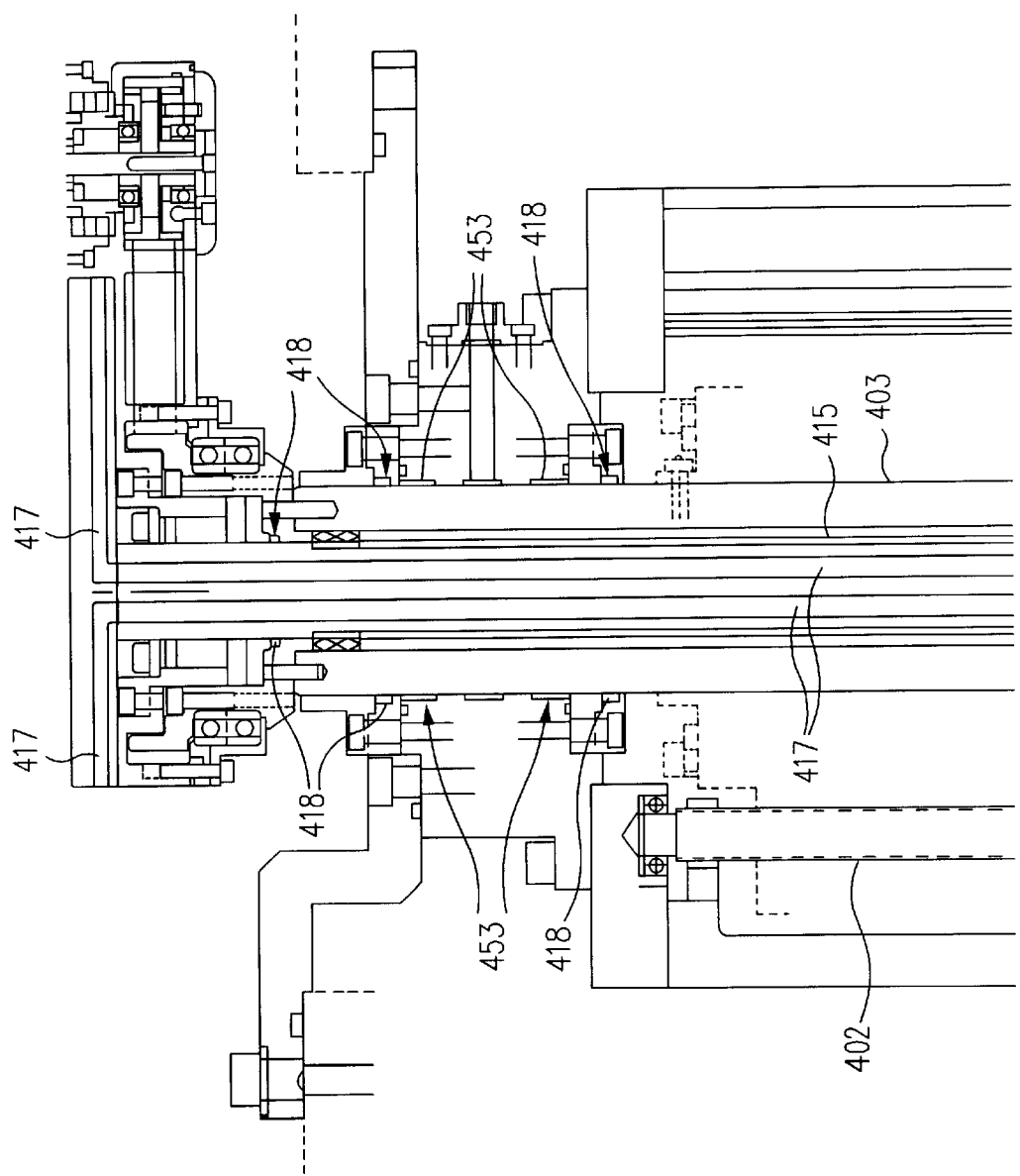
FIG. 3B shows a magnified view of a portion of the robot shown in FIG. 3A.

FIG. 3B, is a magnified view of a top portion of robot 21, which shows seals 418 surrounding vertical driver 403 and rotation driver 415 to create a vacuum seal. Seals 418 can be any type of seal which does not expand and compress with a moving part being vacuum sealed. For example, seals 418 can be o-rings, lip-seals, or t-seals (as opposed to bellows). In one embodiment, seals 418 are of the type Part Numbers TVM300800-T01S, TVM200350-T01S from Busak+Shamban (www.busakshamban.com). Bellows may be used with wafer processing robot 21 to create a vacuum seal around a moving part such as vertical driver 403. Because bellows expand and compress with the moving part, bellows are necessarily made larger when used with moving parts having a long range of motion. This makes bellows impractical for a semiconductor processing robot having a range of motion greater than 200 mm because of the small space. In one embodiment of robot 21, the use of seals 418, instead of bellows, allows vertical driver 403 to be raised up to 350 mm. Thus, robot 21 can access multiple vertically mounted modules, for example, two vertically stacked reactors. To keep seals 418 in place as vertical driver 403 is moved up and down, vertical driver 403 is stabilized using linear guides 405A (FIGS. 3A and 3C) and 405B (FIG. 3C) (e.g. THK Part Number HSR25LBUUC0FS+520LF-II).

Referring again to FIG. 3A, robot 21 includes an end-effector 406, which is made of a heat resistant material such as quartz, for picking-up and placing a wafer. End-effector 406 is fixedly attached to an attachment block 407, which can accept a variety of end-effectors. Block 407 is attached onto an arm 408 and rotates about an axis 410. Arm 408 rotates about an axis 411 and is attached onto an arm 409. End effector 406, which is attached to block 407, can be extended or retracted along a straight line by rotating pulley 455 using an extension motor 413 (e.g. Yaskawa Electric Part Number SGM-02AW12). The entire arm assembly consisting of arm 409, arm 408, block 407, and end-effector 406, can be rotated about an axis 412 by using a rotation motor 414 (e.g. Yaskawa Electric Part Number SGM-02AW12) to rotate rotation driver 415 via a belt 454.

Figure 3C:
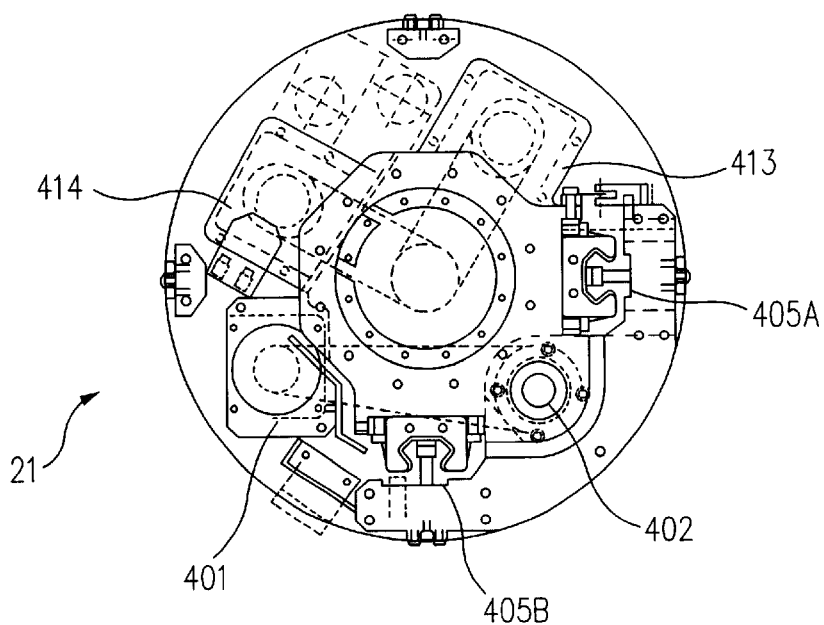
FIGS. 3C and 3D show top "x-ray" views of a robot in one embodiment of the invention.

FIG. 3C is a top view showing the placement of z-axis motor 402, linear guides 405A and 405B, extension motor 413, rotation motor 414, and ball screw 402 in an embodiment of robot 21.

Figure 3D:
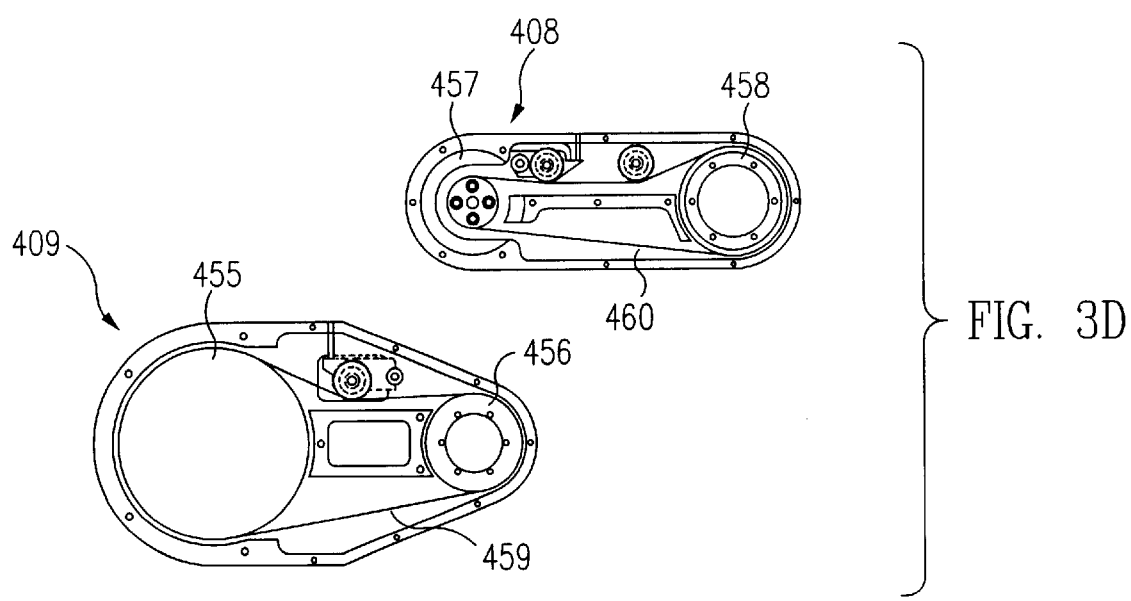

FIG. 3D shows arm 408 and arm 409 separated from their typically joined arrangement to illustrate a conventional belt and pulley arrangement, including pulleys 455, 456, 457, and 458 and belts 459 and 460. The belt and pulley arrangement together provide an example of a means for causing the relative rotational movement of block 407 (FIG. 3A), arm 408 and arm 409.

Figure 4:
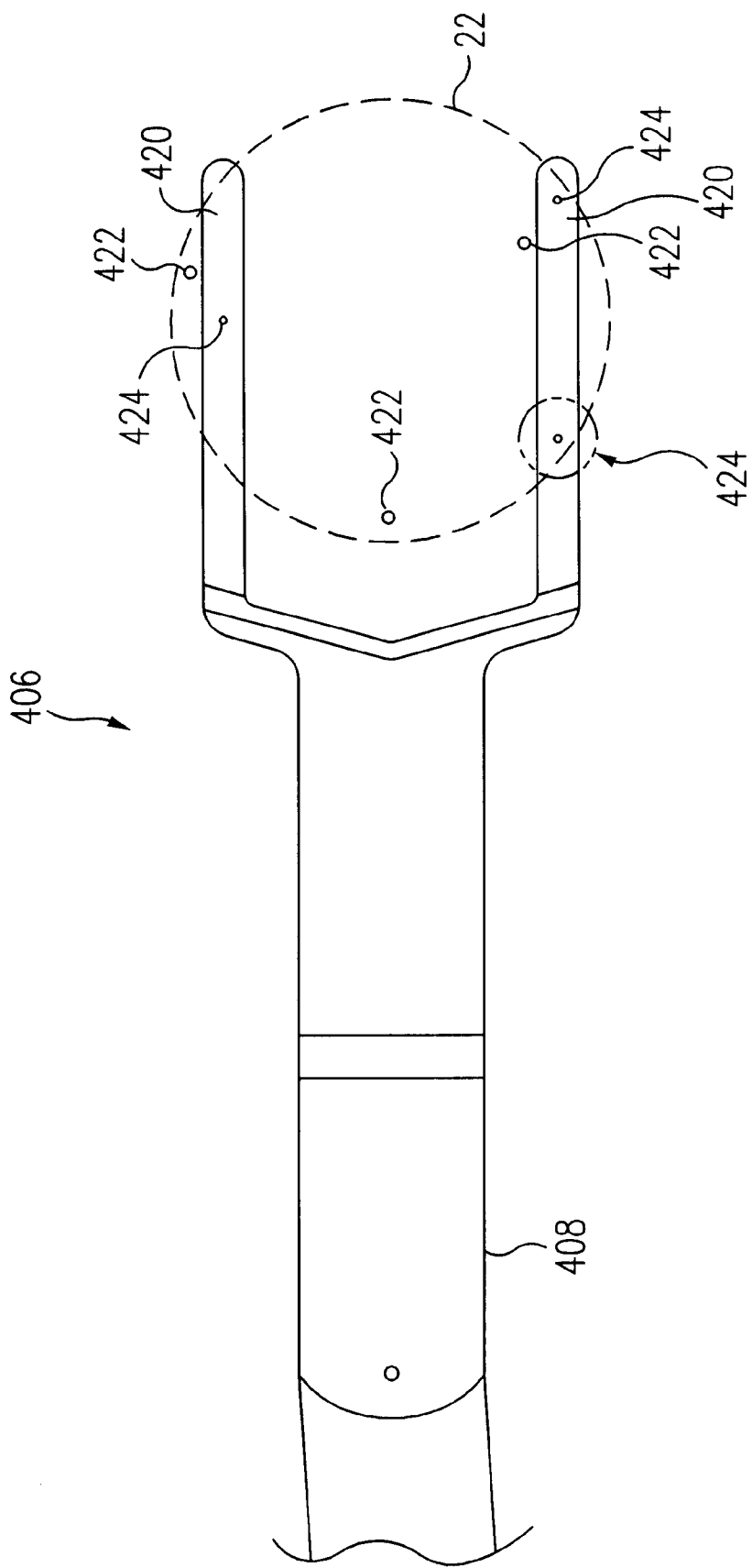
FIG. 4 is a simplified top plan view of an embodiment of an end effector in accordance with the present invention.

In FIG. 4, one embodiment of end effector 406 is shown attached at the end of robot arm 408. In this embodiment, robot arm 408 can urge end effector 406 into reactor 30 or 40 to subsequently pick-up and/or place wafer 22. To hold and transport wafer 22, end effector 406 may have any number of prongs 420, usually one or more, preferably two. Prongs 420 are sized and spaced apart from each other so that as end effector 406 enters reactor 30 or 40, prongs 420 avoid contacting wafer supports 422 disposed therein. Each prong 420 of end effector 406 has at least one wafer contact point 424. Preferably, end effector 406 has a total of at least three contact points 424. Contact points 424 are designed with a minimal surface area to provide a predetermined contact area between wafer 22 and contact points 424. The contact area, if too large may cause thermal shock, since wafer 22 and the contact points 424 may be of different temperatures. If the contact area is too small, the contact points may cause a high pressure point, which can cause mechanical stress in the wafer. In one embodiment, the total contact area between contact points 424 and wafer 22 may be about 350 mm$^2$, preferably about 300 mm$^2$.

Figure 5A:
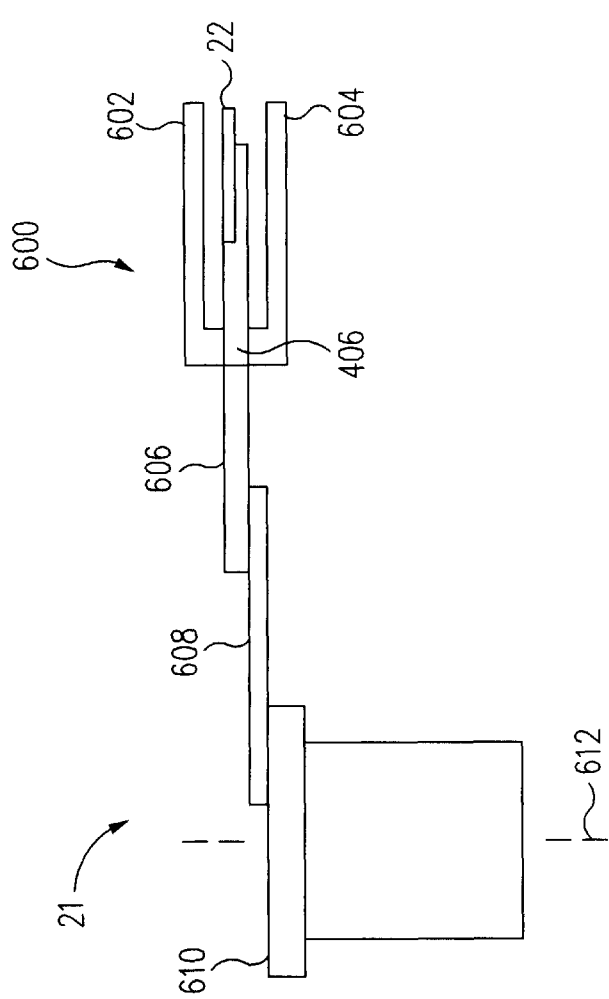
FIG. 5A is a simplified illustration of an embodiment of the present invention.
Figure 9:
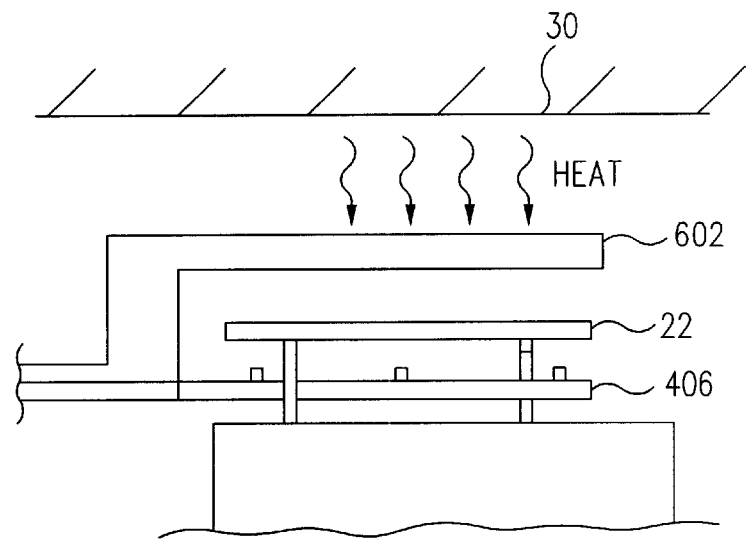
FIG. 9 is a simplified illustration of yet another embodiment of the present invention.

In the embodiment shown in FIG. 5A, robot 21 may also include a shield mechanism 600, which includes at least one heat shield 602 (FIG. 9). Optionally, in some instances, shield mechanism 600 includes more than one heat shield, for example, an additional heat shield 604. Because heat shields 602 and 604 are structurally and functionally the same, any reference to heat shield 602 also applies to heat shield 604, unless indicated. Shield mechanism 600 can be used in conjunction with end effector 406 to shield wafer 22, within the reactor, for a period of time, prior to the removal of wafer 22. Using shields 602 and 604 to essentially cover a top and bottom portion of wafer 22 can substantially reduce the potential for slip dislocations occurring in wafer 22 by reducing the temperature of the wafer before it is contacted by end effector 406. Heat shields 602 and 604 can be made of quartz, preferably an opaque quartz, or similar material, which can provide an adequate barrier from heat radiated from the internal walls of, for example, reactor 30.

Figure 6:
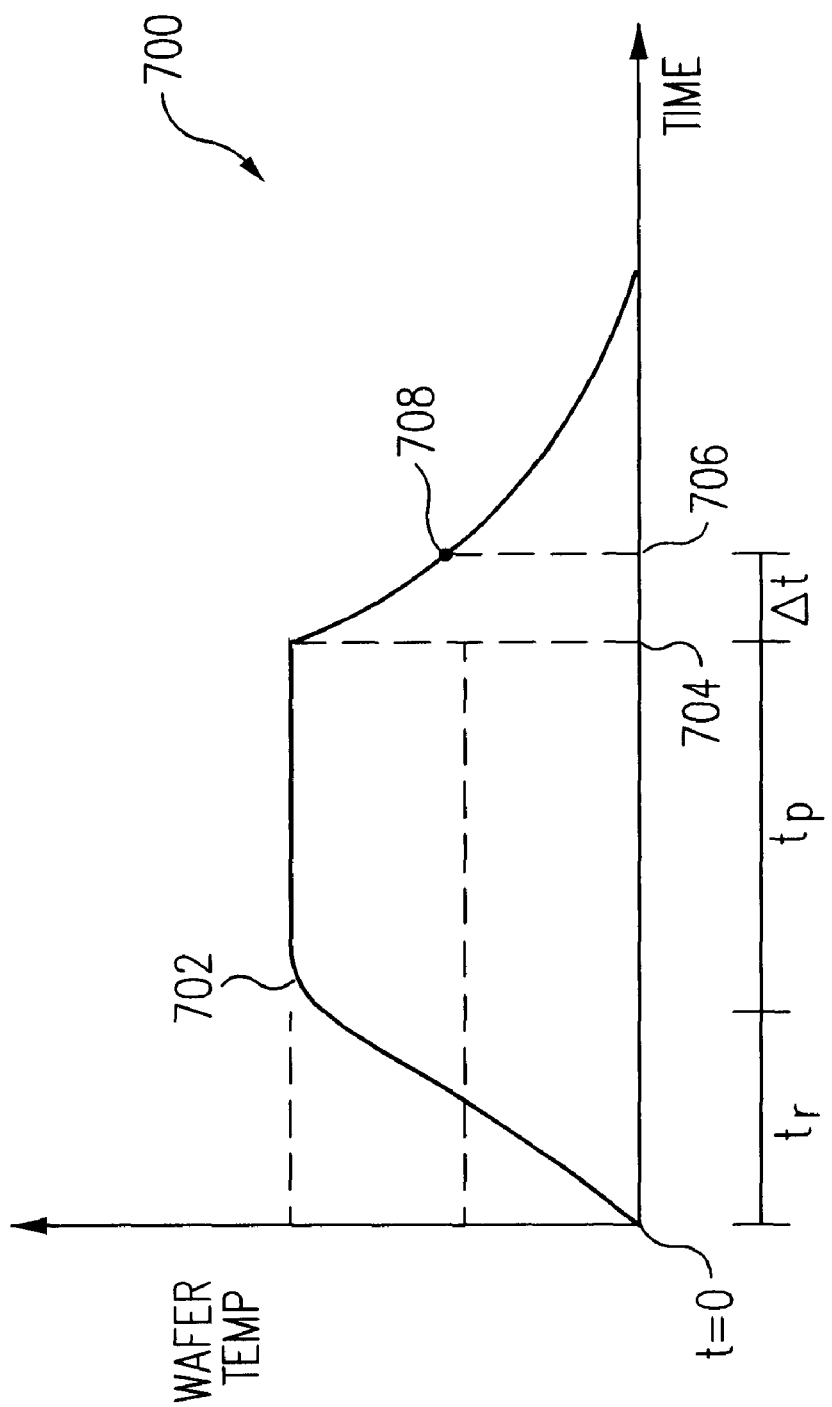
FIG. 6 is a graph of the wafer temperature change which can occur in accordance with an embodiment of the present invention.

As illustrated in FIG. 6, graph 700 indicates that after the wafer is placed into the reactor (at t=0), the temperature of the wafer increases for a time, $t_r$ until it reaches a processing temperature 702. The wafer is processed for a suitable period of time, $t_p$. In accordance with the present invention, after time $t_r+t_p$, heat shields 602 and 604 enter the reactor at time 704, and may or may not be accompanied by end effector 406. Shields 602 and 604 screen or cast a shadow over the wafer. The shields cause the wafer temperature to drop. After the temperature of the wafer has dropped to below a critical temperature 708, usually after a time Δt, end effector 406 can enter the reactor (if it has not already been inserted) and safely pick-up the wafer and remove it from the reactor. The critical temperature, mentioned above, may vary depending on the physical characteristics of the wafer and the support geometry. For example, the uniform temperature for defect-free processing of a typical 300 mm wafer, supported in an RTP reactor using a peripheral support ring (see FIG. 10), may range from between about 1150° C. to about 1400° C. For a typical 200 mm wafer, supported in the same manner, the temperature range is from about 1250° C. to 1400° C.

Figure 7A:
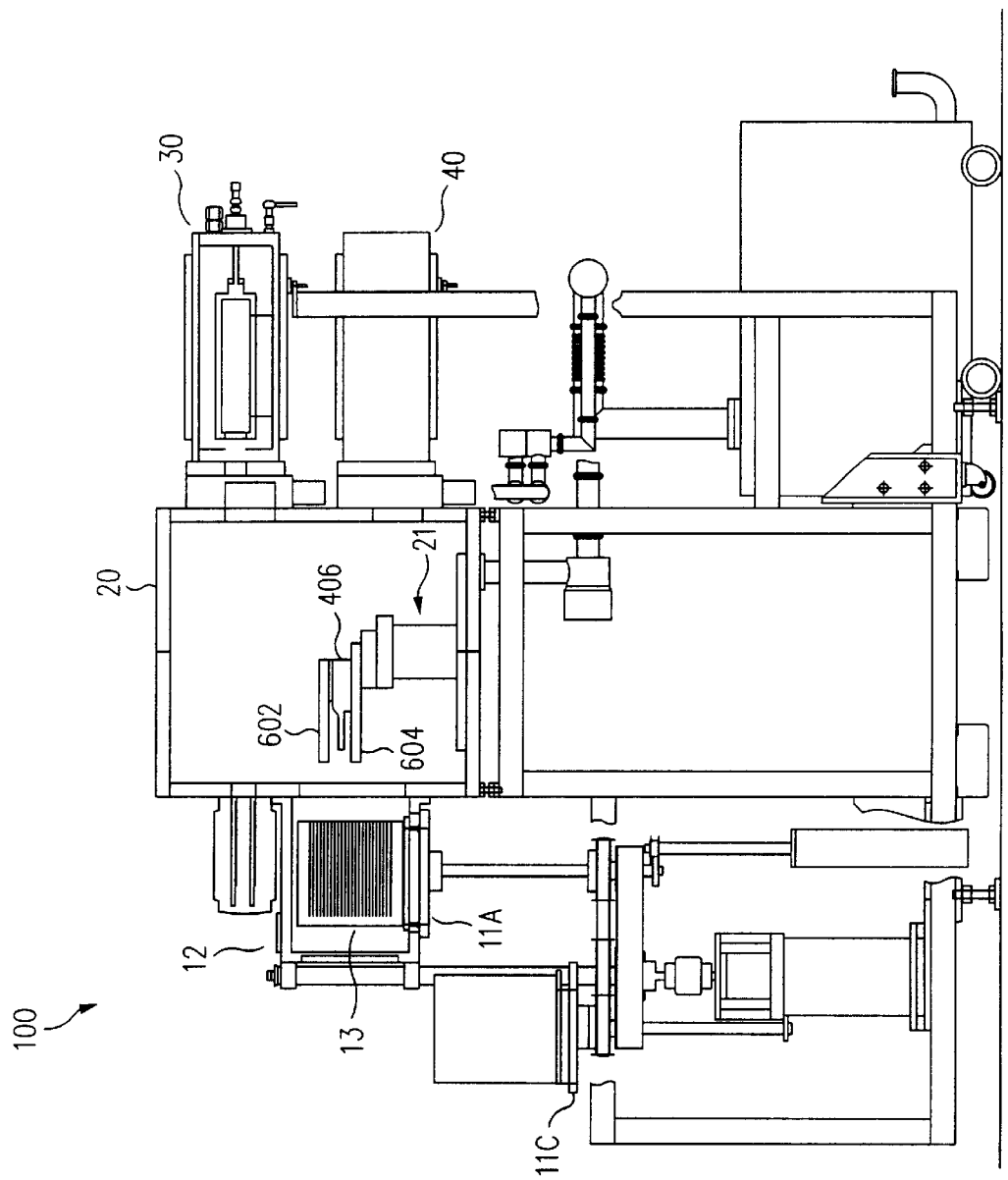
FIGS. 7A–7E show side views of the wafer processing system shown in FIG. 1A illustrating the movement of a wafer from a carrier in a load lock to a reactor in accordance with an embodiment of the present invention.
Figure 7B:
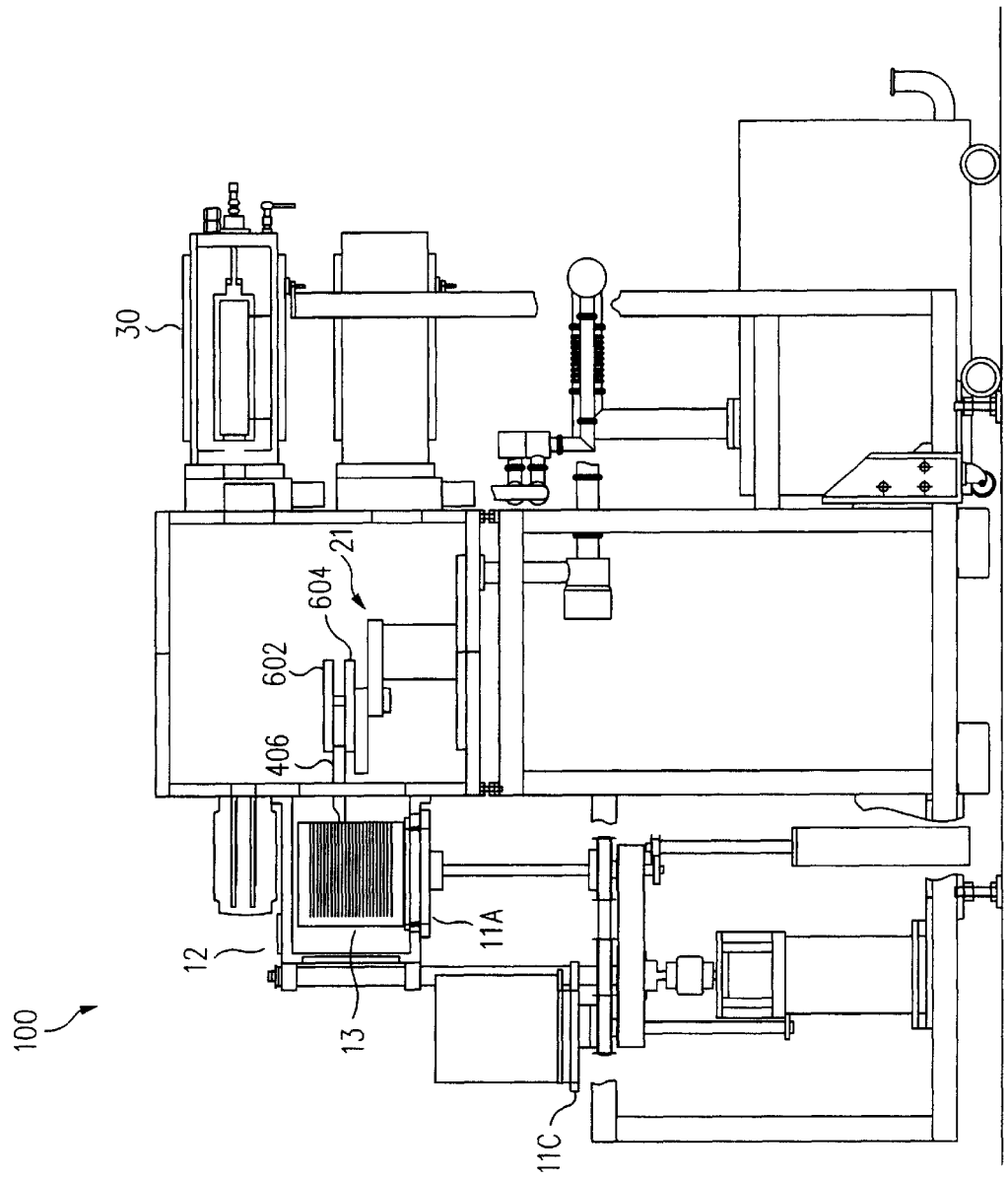
Figure 7C:
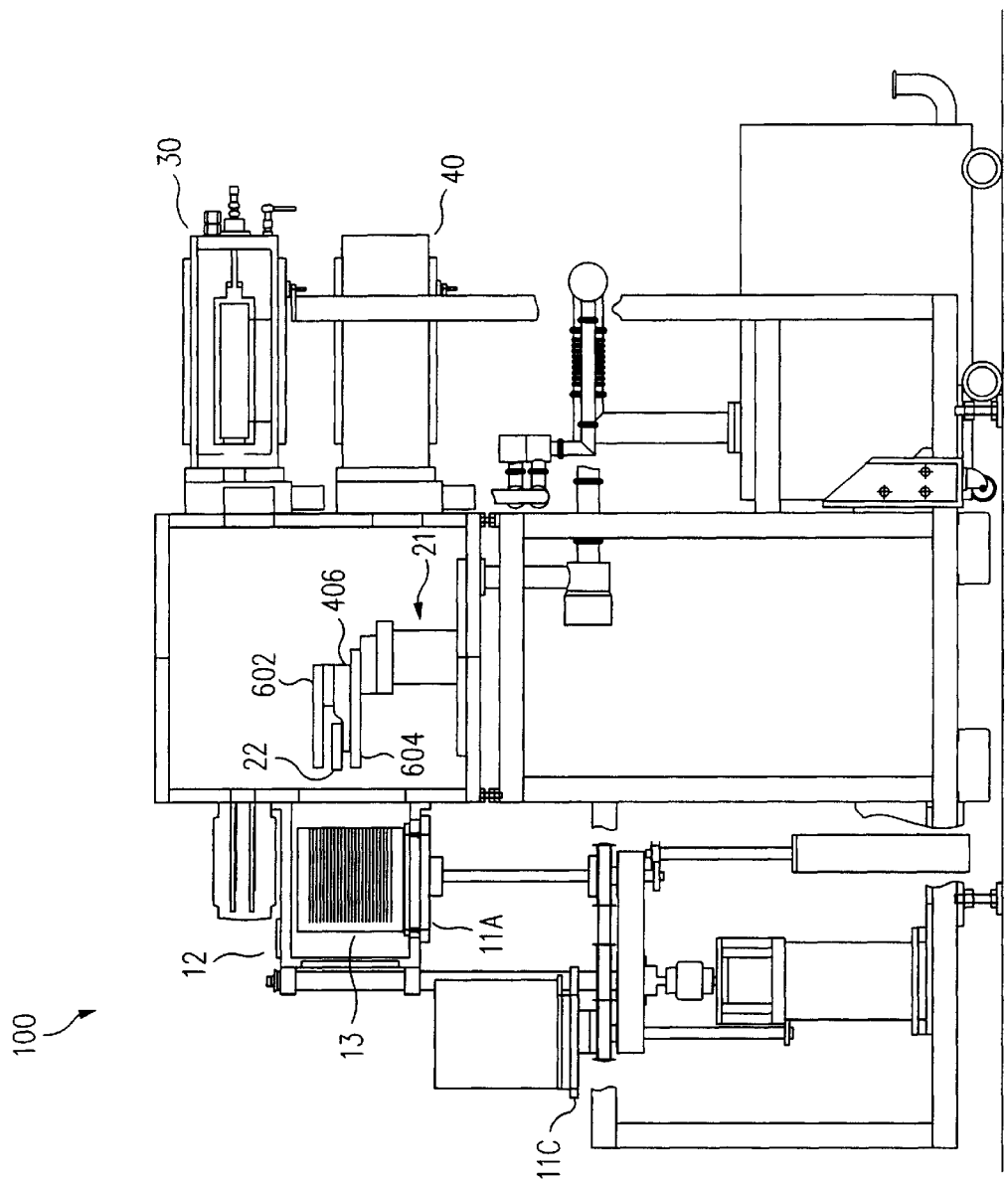
Figure 7D:
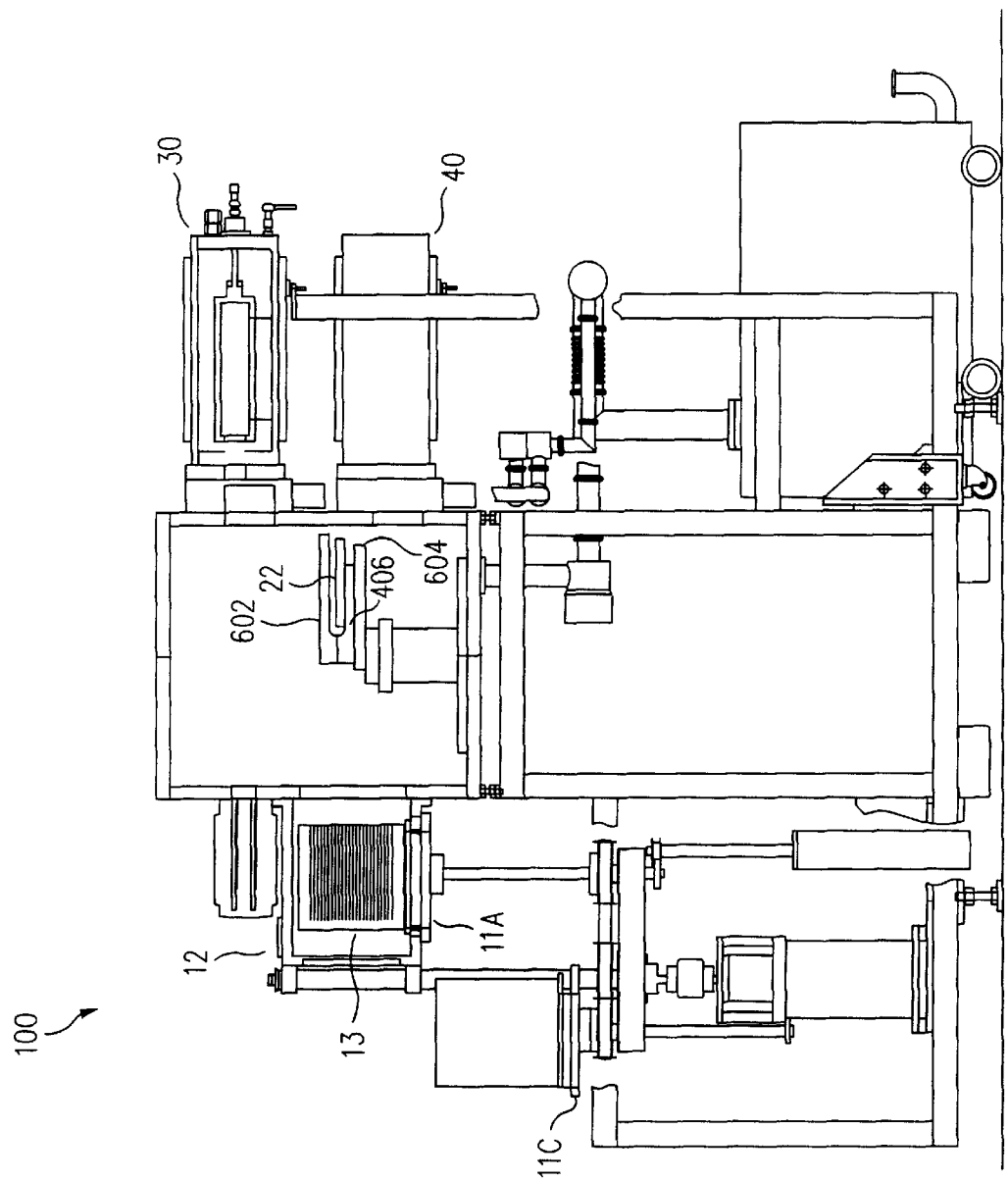
Figure 7E:
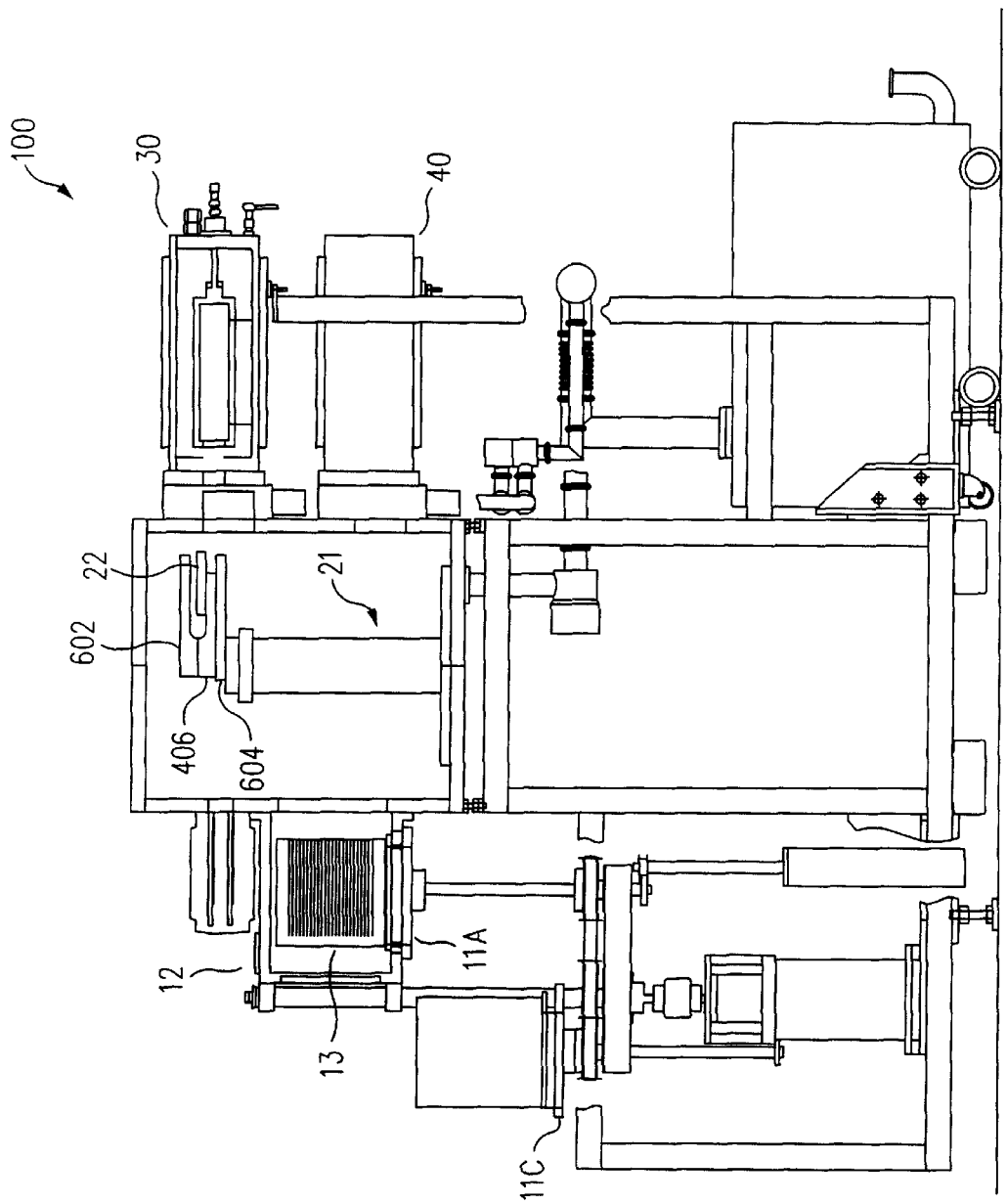

FIGS. 7A to 7E show simplified side views of system 100 illustrating one embodiment of the movement of wafer 22 from carrier 13, which is inside load lock 12, to reactor 30 (or 40) in accordance with the present invention. Once carrier 13 is inside load lock 12, robot 21, in transfer chamber 20, rotates end effector 406 and heat shields 602 and 604 and lowers these components towards load lock 12 (FIG. 7A). In this embodiment, robot 21 extends end-effector 406 to pick up wafer 22 from wafer carrier 13 (FIG. 7B), while heat shields 602 and 604 remain in transfer chamber 20. Optionally, if space permits, shields 602 and 604 can be configured to enter carrier 13 with end effector 406. Robot 21 then retracts (FIG. 7C) with wafer 22. The robot rotates wafer 22 and heat shields 602 and 604 towards reactor 30 (FIG. 7D), elevates to position wafer 22 in-line with reactor 30 (FIG. 7E).

Figure 8A:
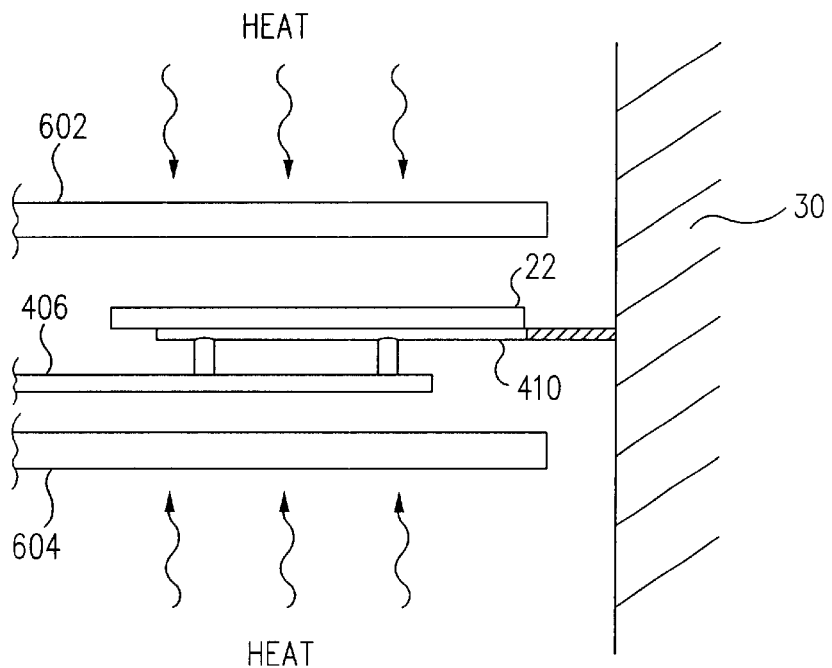
FIG. 8A is a simplified illustration of an embodiment of the present invention.

As best described with reference to FIG. 8A, robot 21 (not shown) extends end effector 406 into reactor 30 to place wafer 22 onto wafer holder 410 (See FIG. 9). It should be understood that in some embodiments, the initial insertion of wafer 22 into reactor 30 before processing may be done without shields 602 and 604 in position over or adjacent to wafer 22. Accordingly, as described below, shields 602 and 604 can be configured to remain in transfer chamber 20 during insertion of the wafer.

Robot 21 and shields 602 and 604 (if inserted) then retract out from reactor 30 and subsequently, the processing of wafer 22 can begin. After wafer 22 is processed in a well-known manner inside reactor 30, robot 21 and shields 602 and 604 are re-inserted into reactor 30. As best understood from the illustration in FIG. 8A, shield 602 is arranged adjacent to a top portion of wafer 22, while shield 604 is arranged adjacent to a bottom portion of wafer 22. Each shield 602 and 604 blocks wafer 22 from radiation heating, which allows wafer 22 to cool, while still in reactor 30, to a temperature below a predetermined critical temperature.

In an alternative embodiment illustrated in FIG. 9, reactor 30 may be a single surface heating device. In this alternative embodiment, only a single heat shield 602 is used to block the energy radiating from a single surface of reactor 30. In either embodiment, once wafer 22 has cooled to below the critical temperature, robot 21 causes end effector 406 to pick-up wafer 22. End effector 406 and heat shields 602 and 604 are then retracted together to move wafer 22 into transfer chamber 20.

Figure 5B:
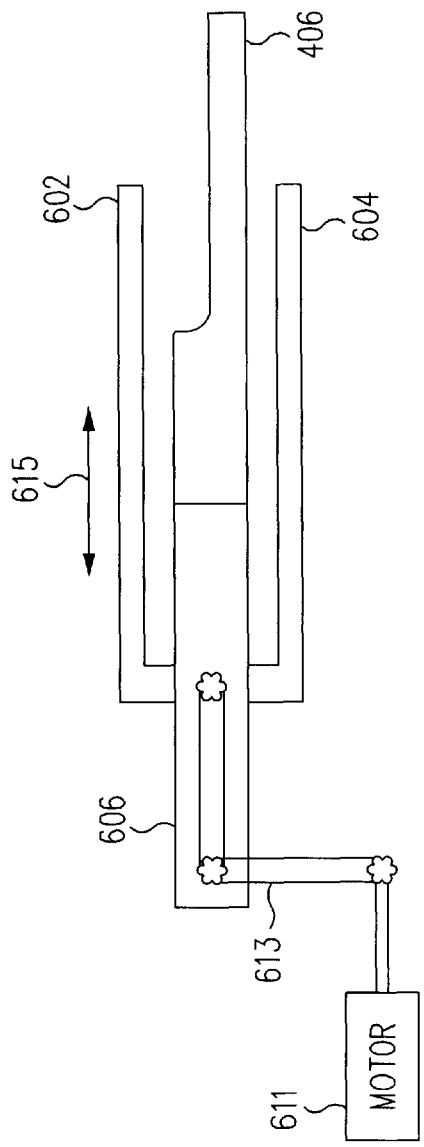
FIG. 5B is a simplified illustration of an embodiment of the present invention.

In one embodiment, the extension and/or retraction of shield mechanism 600 is accomplished in a manner similar to end effector 406. For example, as shown in simplified FIG. 5A, shield mechanism 600 may be coupled to arm 610. A conventional mechanical drive system 613, which can include a belt and pulley arrangement, a gear box, and/or a chain and sprocket arrangement, mechanically couples arm 610, arm 608, and block 606 together. As shown in FIG. 5B, end effector 406 and shields 602 and 604 are movably coupled to block 606, can be extended or retracted along a straight line 615 by rotating mechanical drive system 613, using for example, a motor 611 (e.g. Yaskawa Electric Part Number SGM-02AW12).

Figure 8B:
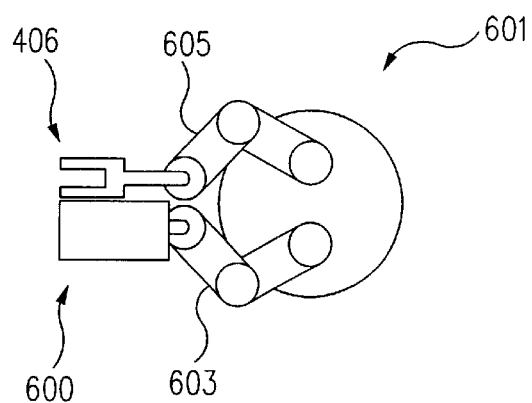
FIG. 8B is a simplified top view illustration of a dual arm robot in accordance with one embodiment of the present invention

In one embodiment, end effector 406 and shield mechanism 600 can be configured to extend and retract independently of one another. In this manner, end effector 406 can be moved into load lock 12 or reactor 30 while shield mechanism 600 remains still (in the transfer chamber) and vice-versa. In one embodiment, the independent movement of end effector 406 and shield mechanism 600 can be accomplished using a dual arm robot 601, such as that shown in FIG. 8B. A first arm of the dual armed robot 603 can support shield mechanism 600 while a second robot arm 605 can carry end effector 406. A commercially available dual arm robot suitable for use with the present invention, is Model No. RR701, manufactured by Rorze Automation, Inc. of Milpitas, Calif. In either the single arm embodiment or the dual arm embodiment, the robot arms can be rotated about an axis using a rotation motor (e.g. Yaskawa Electric Part Number SGM-02AW12). In another embodiment, (FIG. 7A–7E) end effector 406 and heat shield mechanism 600 can be arranged in a telescopic arrangement such that end effector 406 can be extended with or without heat shield mechanism 600.

Because newly processed wafers may have temperatures upwards of 200° C. or higher and could melt or damage a typical wafer carrier, cooling station 60 (FIG. 1A) is provided for cooling the wafers before placing them back into a wafer carrier in load lock 12. In this embodiment, cooling station 60 is vertically mounted above load lock 12 to minimize the floor space area occupied by system 100. Cooling station 60 includes shelves 61, which may be liquid-cooled, to support multiple wafers at a time. While two shelves are shown in FIG. 1A, of course, a different number of shelves can be used, if appropriate, to increase throughput. Subsequently, when adequately cooled, such as after a predetermined time, wafer 22 is picked-up from cooling station 60 and replaced to its original slot in carrier 13 on platform 11A using robot 21. Platform 11A lowers from load lock 12 and rotates out of position to allow another platform to move a next wafer carrier into load lock 12. A seal may be provided between load lock 12 and transfer chamber 20, which creates a vacuum seal. When platform 11A is up in load lock 12, the seal on platform 11A contacts the bottom opening portion of load lock 12. During processing which requires vacuum, a pneumatic cylinder pushes platform 11A up into load lock 12 such that the seal is compressed against load lock 12 to create a vacuum seal. Also, vacuum within load lock 12 draws in platform 11A into load lock 12, further enhancing vacuum sealing.

Figure 10:
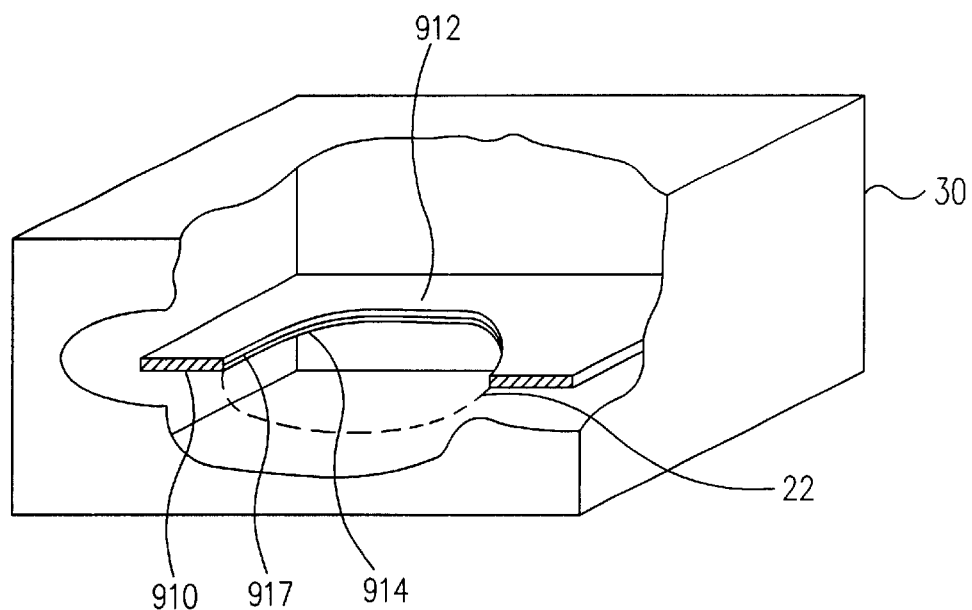
FIG. 10 is a simplified cut-away perspective view of the reactor of the present invention with an embodiment of the wafer support therein.

FIG. 10 is a simplified perspective view of an embodiment of reactor 30, with a portion of the reactor cut-away to show wafer support 910. To ensure that the heat shields may be inserted into reactor 30 without striking wafer support structure 910, wafer support structure 910 can be formed into or mounted onto the inner walls of reactor 30. Conventional fabrication techniques are used to mount wafer support 910, such as welding, mechanical fastening, tongue and groove, and the like. Wafer support 910 includes an open central portion 912, which has a lipped rim portion 914. Lipped rim portion 914 is sized to contact and support a peripheral edge 917 of wafer 22 (shown in phantom) during processing. The thickness of wafer support 910 is typically greater than wafer 22, but thin enough to ensure that reactor 30 has space to accommodate the insertion of shield mechanism 600 and end effector 406 (FIG. 5A) without the shield mechanism 600 or end effector contacting wafer support 910.

Figure 11:
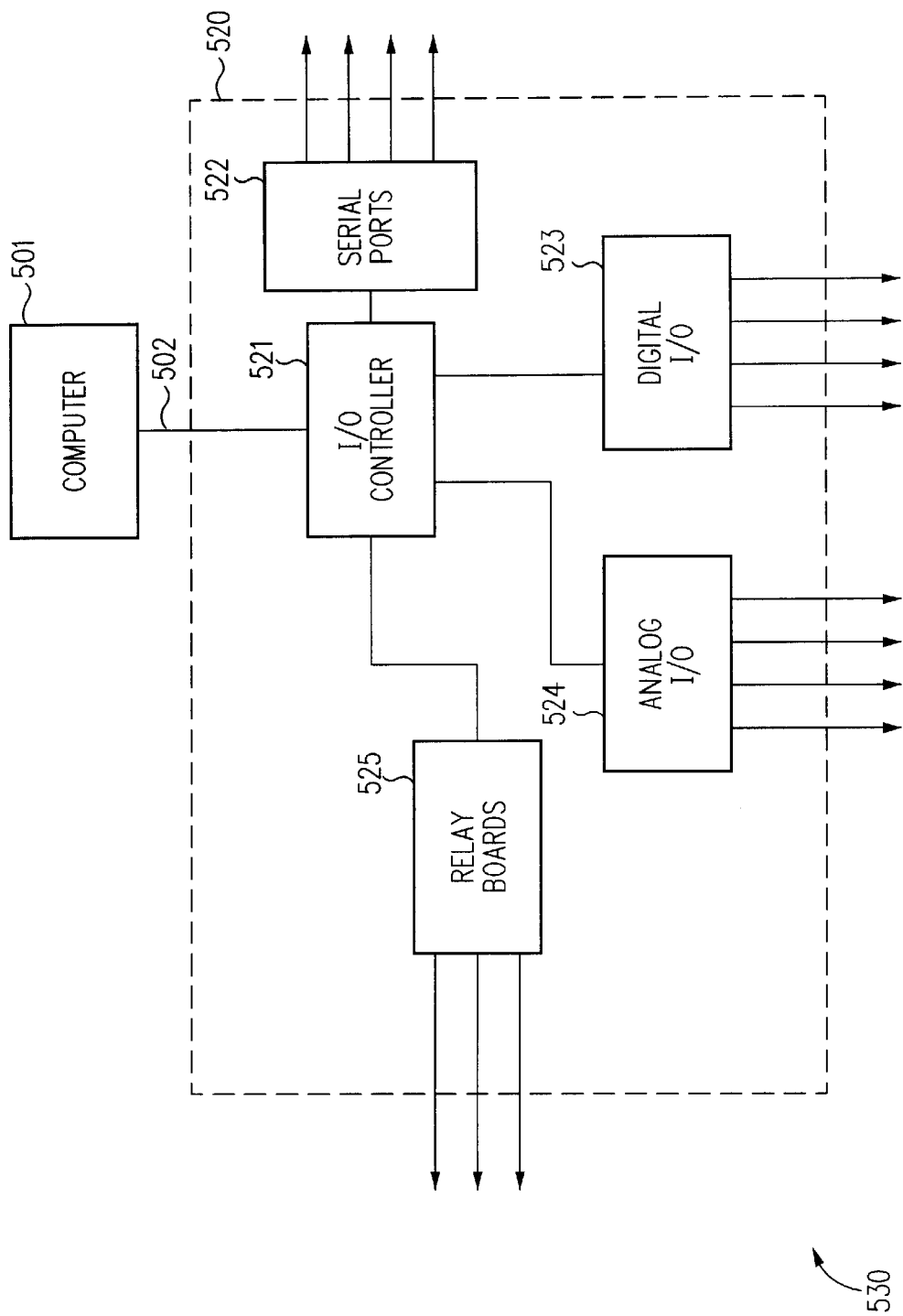
FIG. 11 shows in block diagram form a control system for controlling the wafer processing system shown in FIGS. 1A and 1B.

FIG. 11 shows a block diagram of a control system 530 used in system 100. A computer 501 communicates with a controller 520 using an ethernet link 502 to an input/output ("I/O") controller 521. I/O controller 521 can accommodate a variety of I/O boards including: (a) serial ports 522 for communicating with robot, temperature, pressure, and motor controllers; (b) digital I/O 523 for controlling digital I/O lines such as sensors; (c) analog I/O 524 for controlling analog signal activated devices such as mass flow controllers and throttle valves; and (d) relay boards 525 for making or breaking continuity of signal lines such as interlock lines. Components for building controller 520 are commercially available from Koyo Electronics Industries Co., Ltd., 1-171 Tenjin-cho, Kodaira Tokyo 187-0004, Japan. Control system 530 uses conventional control software for activating and monitoring various components of system 100. System 100 may also use any conventional control hardware and software such as those available from National Instruments Corporation of Austin, Tex.

Having thus described the preferred embodiments, persons skilled in the art will recognize that changes may be made in form and detail without departing from the spirit and scope of the invention. Thus the invention is limited only by the following claims.

What is claimed is:

1. A semiconductor wafer processing system, the system comprising:
   a process chamber defining a cavity configured to receive a wafer therein;
   a robot operable to move a wafer to and/or from the process chamber; and
   a shield mechanism operable to shield an entire surface of the wafer from a heating sources said robot including an end effector, said shield mechanism coupled to said end effector and operable to extend into said process chamber simultaneously with said end effector.

2. The system of claim 1, wherein said shield mechanism comprises a single shield capable of being arranged adjacent a surface of said wafer.

3. The system of claim 1, wherein said process chamber comprises a rapid thermal processor (RTP).

4. The system of claim 1, wherein said heating source comprises resistive heating elements.

5. The system of claim 1, wherein said shield mechanism comprises a first shield and a second shield, said first shield operable to be arranged adjacent a top portion of said wafer, said second shield operable to be arranged adjacent a bottom portion of said wafer.

6. The system of claim 1, wherein said shield mechanism comprises a heat shielding material taken from the group consisting of quartz.

7. A semiconductor wafer processing system, the system comprising:
   a process chamber defining a cavity configured to receive a wafer therein;
   a robot operable to move a wafer to and/or from the process chamber; and
   a shield mechanism operable to shield an entire surface of the wafer from a heating source, said robot including an end effector, said shield mechanism coupled to said end effector and operable to be retracted from said process chamber simultaneously with said end effector.

8. A system for inserting and/or removing a semiconductor wafer from a reactor, said system comprising:
   an end effector operable to pick-up and place a wafer; and
   a shield mechanism mounted to said end effector and operable to screen an entire surface of said wafer from a heat source to cause the temperature of said wafer to be reduced.

9. The system of claim 8, wherein said shield mechanism comprises a first shield operable to screen a top surface of said wafer and a second shield operable to screen a bottom surface of said wafer.

10. The system of claim 8, wherein said shield mechanism is operable to be retracted from said process chamber simultaneously with said end effector.

11. A method for processing a semiconductor wafer, said method comprising:
    providing a wafer processing chamber;
    providing a robot having an end effector;
    inserting a shield mechanism coupled with said end effector into said wafer processing chamber to a first location where said shield mechanism overlaps an entire surface of a processed wafer; said shield mechanism causing a temperature of said processed wafer to be reduced.

12. The method of claim 11, wherein said shield mechanism comprises a first shield arrangeable adjacent a portion of said wafer subjected to a first heat source.

13. The method of claim 12, wherein said shield mechanism comprises a second shield arrangeable adjacent a portion of said wafer subjected to a second heat source.

14. A method of processing a semiconductor wafer, said method comprising:

inserting a shield mechanism and a robot arm into a wafer processing chamber, said shield mechanism coupled to said robot arm, said robot arm configured to move said shield mechanism to a first position such that in said first position said shield mechanism covers an entire surface of a processed wafer to cause a temperature of said processed wafer to be reduced; and retracting said robot arm to remove said shield mechanism and said processed wafer from said processing chamber.

15. The method of claim 14, wherein said shield mechanism comprises a first shield arrangeable adjacent a portion of said wafer subjected to a first heat source.

16. The method of claim 15, wherein said shield mechanism comprises a second shield arrangeable adjacent a portion of said wafer subjected to a second heat source.

17. A method for processing a semiconductor wafer within a wafer processing system, said method comprising:

lowering the temperature of a processed semiconductor wafer by introducing at least one heat shield coupled to a robotic arm into a reactor such that the at least one heat shield is positioned to overlap at least one entire surface of said processed semiconductor wafer; and, thereafter removing said processed semiconductor wafer and said at least one heat shield from said reactor using said robotic arm having an end effector.

18. The method of claim 17, wherein said at least one heat shield is disposed between a surface of the wafer and a heat source within said reactor.

19. The method of claim 17, wherein said at least one heat shield comprises a first and a second heat shield, said first heat shield disposed adjacent a first surface of said wafer, and said second heat shield disposed adjacent a second surface of said wafer.

20. A semiconductor wafer processing system, the system comprising:

a process chamber defining a cavity configured to receive a wafer including a single opening;

an end effector coupled to a first robot operable to move said wafer into and out from said process chamber; and a shield mechanism coupled to a second robot operable to move said shield mechanism to a first location where said shield mechanism overlaps an entire surface of the wafer when said wafer is disposed in said cavity, said first robot and said second robot configured to enter and exit through said single opening of said process chamber.

21. The system of claim 20, wherein said process chamber comprises a rapid thermal processor (RTP).

22. The system of claim 20, wherein said shield mechanism comprises a first shield and a second shield, said first shield operable to be arranged adjacent a top portion of said wafer, said second shield operable to be arranged adjacent a bottom portion of said wafer.

23. The system of claim 20, wherein said shield mechanism comprises a heat shielding material taken from the group consisting of quartz.

24. The system of claim 20, wherein said shield mechanism is operable to be retracted from said process chamber simultaneously with said end effector through said single opening.

25. The system of claim 20, wherein said shield mechanism is operable to extend into said process chamber simultaneously with said end effector through said single opening.

\* \* \* \* \*